United States Patent [19]
Chang et al.

[11] Patent Number: 5,792,681
[45] Date of Patent: Aug. 11, 1998

[54] FABRICATION PROCESS FOR MOSFET DEVICES AND A REPRODUCIBLE CAPACITOR STRUCTURE

[75] Inventors: Tzong-Sheng Chang, Chang-Hua; Chen-Cheng Chou, Taichung, both of Taiwan

[73] Assignee: Taiwan Semiconductor Manufacturing Company, Ltd., Hsinchu, Taiwan

[21] Appl. No.: 783,983

[22] Filed: Jan. 15, 1997

[51] Int. Cl.[6] .................. H01L 21/8238; H01L 21/8242
[52] U.S. Cl. ..................... 438/210; 438/239; 438/233
[58] Field of Search .................... 438/210, 241, 438/238, 239, 253, 381, 396; 257/296, 306

[56] References Cited

U.S. PATENT DOCUMENTS

| | | | |
|---|---|---|---|
| 5,187,636 | 2/1993 | Nakao | 361/313 |
| 5,286,991 | 2/1994 | Hui et al. | 257/306 |
| 5,364,804 | 11/1994 | Ho et al. | 437/41 |
| 5,376,593 | 12/1994 | Sandhu et al. | 437/242 |
| 5,401,678 | 3/1995 | Jeong et al. | 437/44 |
| 5,547,893 | 8/1996 | Sung | 438/210 |
| 5,633,181 | 5/1997 | Hayashi | 438/210 |

*Primary Examiner*—Joni Chang
*Attorney, Agent, or Firm*—George O. Saile; Stephen B. Ackerman

[57] ABSTRACT

A process has been developed in which a capacitor structure can be simultaneously fabricated with NFET and PFET to be used in EEPROM, SRAM or DRAM cells. The process features the use of a silicon nitride layer, protecting an underlying capacitor dielectric layer from an oxidation ambient, presented during a subsequent NFET source and drain drive-in procedure.

11 Claims, 10 Drawing Sheets

FABRICATION PROCESS FOR MOSFET DEVICES AND A REPRODUCIBLE CAPACITOR STRUCTURE

BACKGROUND OF THE INVENTION (1) Field of the Invention

The present invention relates to processes used to fabricate semiconductor devices, and specifically to a process used to simultaneously fabricate a capacitor structure and metal oxide semiconductor field effect transistors, (MOSFET), devices.

(2) Description of Prior Art

The semiconductor industry is continually striving to improve the performance of semiconductor chips, while still attempting to decrease the cost of these same semiconductor chips. These objectives have been partially realized via the trend to micro-miniaturization, or the ability of the semiconductor industry to fabricate semiconductor devices featuring sub-micron features. The use of sub-micron features result in smaller devices, reducing device capacitances and resistances, thus offering performance benefits. In addition the attainment of smaller chips, via micro-miniaturazation, allows a greater number of these smaller chips to be obtained from a specific size starting substrate, thus reducing the processing cost for a specific chip. The ability to create semiconductor devices with sub-micron features has resulted from advances in specific semiconductor fabrication disciplines, such as photolithography and reactive ion etching. For example the use of more advanced exposure cameras, as well as the use of more sensitive photoresist materials, have enabled sub-micron images to be routinely obtained in photoresist layers. In addition the development of more sophisticated dry etching tools and processes have allowed the sub-micron images in photoresist layers to be successfully transferred to underlying materials used in the creation of semiconductor devices.

Another method used to reduce the processing costs for semiconductor chips, is the technique of simultaneously fabricating the various device types needed for a specific semiconductor chip. For example logic and memory chips, used for static random access memory, (SRAM), dynamic random access memory, (DRAM), erasable electrically programmable read only memory, (EEPROM), cells, incorporate various semiconductor devices such as capacitors, resistors, diodes, as well as p-channel MOSFETS, (PFET), and n-channel MOSFET, (NFET), devices. The ability to simultaneously fabricate, and integrate these specific device types, simplifies, and reduces the cost of the fabrication process. One such design benefitting from the cost reducing, and simplified, integrated process is the design using a capacitor, in addition to both PFET and NFET devices. One polysilicon layer is used for the plate of the capacitor, as well as for the gate structure for both PFET and NFET devices. However in this design the capacitor dielectric, a silicon oxide layer grown on the underlying polysilicon plate, is exposed to a source and drain drive-in sequence, used for PFET and NFET processing. The drive-in, although performed in an non-oxidizing ambient, such as nitrogen, still presents a finite level of moisture or oxygen in the nitrogen gas or in the anneal furnace, which can result in an unwanted, and random increase in capacitor dielectric thickness, adversely influencing the attainment of the desired capacitor characteristics. This invention will present a process for integrating PFET and NFET devices, with capacitor structures, however using a structure and process which protects the capacitor dielectric from the effects of the source and drain drive-in ambient. In this invention a layer of silicon nitride is integrated into the capacitor structure, at a point in the process prior to the source and drain drive-in. Prior art, such as Sandhu, et al, in U.S Pat. No. 5,376,593, describe a capacitor with dielectric layers of silicon nitride and silicon oxide, however without the integration of the PFET and NFET devices, and specifically without the drive-in cycles, which adversely influences the unprotected capacitor dielectric layer.

SUMMARY OF THE INVENTION

It is an object of this invention to use a single fabrication process to form both a capacitor structure, and MOSFET devices, for a semiconductor chip.

It is another object of this invention to use a capacitor structure comprised of a polysilicon bottom electrode, a dielectric layer of silicon oxide, thermally grown from the underlying polysilicon layer, used for the bottom electrode, and a metal upper electrode.

It is still another object of this invention to form the gate structures for the MOSFET devices, and the bottom electrode for the capacitor structure, from a single polysilicon layer.

It is still yet another object of this invention to use a silicon nitride layer, overlying the capacitor dielectric layer of silicon oxide, to protect the silicon oxide dielectric layer from the ambient used for the MOSFET source and drain drive-in procedures.

In accordance with the present invention a method is described for simultaneously fabricating a capacitor structure and MOSFET devices, in which a thin layer of silicon nitride is used to protect the capacitor dielectric layer from a MOSFET source and drain drive-in ambient. Field oxide regions are formed to provide isolation between subsequent PFET, NFET and capacitor structures, and to provide the underlying material for a subsequent capacitor structure. After thermal growth of a gate insulator layer, in areas not covered by field oxide regions, a polysilicon layer, and an overlying silicon oxide layer are deposited. Patterning of the silicon oxide and polysilicon layers, is performed to create polysilicon gate structures, on the gate insulator layer, in regions where subsequent PFET and NFET devices will be formed, while patterning of the silicon oxide and polysilicon layers, is also performed to create the bottom electrode for the subsequent capacitor structure, on the underlying field oxide region. After creation of insulator spacers on the polysilicon gate structures, a thin layer of silicon oxide is thermally grown on the top surface of the polysilicon bottom electrode, to be used for the capacitor dielectric layer of the subsequent capacitor structure. An N+ source and drain ion implantation is performed in the region to be used for the NFET devices, followed by the blanket deposition of a silicon nitride layer. An anneal, used to activate, as well as drive-in, the N+ implanted species is next performed with the capacitor dielectric layer of silicon oxide protected with the overlying silicon nitride layer during the anneal cycle. Another implantation procedure is next performed to create the PFET source and drain regions. A boro-phosphosilicate, (BPSG), passivating layer is next deposited, and annealed to create a smooth topography overlying MOSFET and capacitor structures. Contact holes are next opened in the BPSG layer to expose the bottom electrode of the capacitor structure, as well as exposing regions of the MOSFET devices, to be subsequently contacted by interconnect metallization structures. Another opening in the BPSG layer is made to expose the thin capacitor dielectric layer, and to define the capacitor area. Metal structures are then formed to contact the bottom electrode of the capacitor, as well as providing the upper electrode of the capacitor structure.

BRIEF DESCRIPTION OF THE DRAWINGS

The object and other advantages of this invention are best described in the preferred embodiment with reference to the attached drawing that include.

DESCRIPTION OF THE PREFERRED EMBODIMENTS

Figure 1:
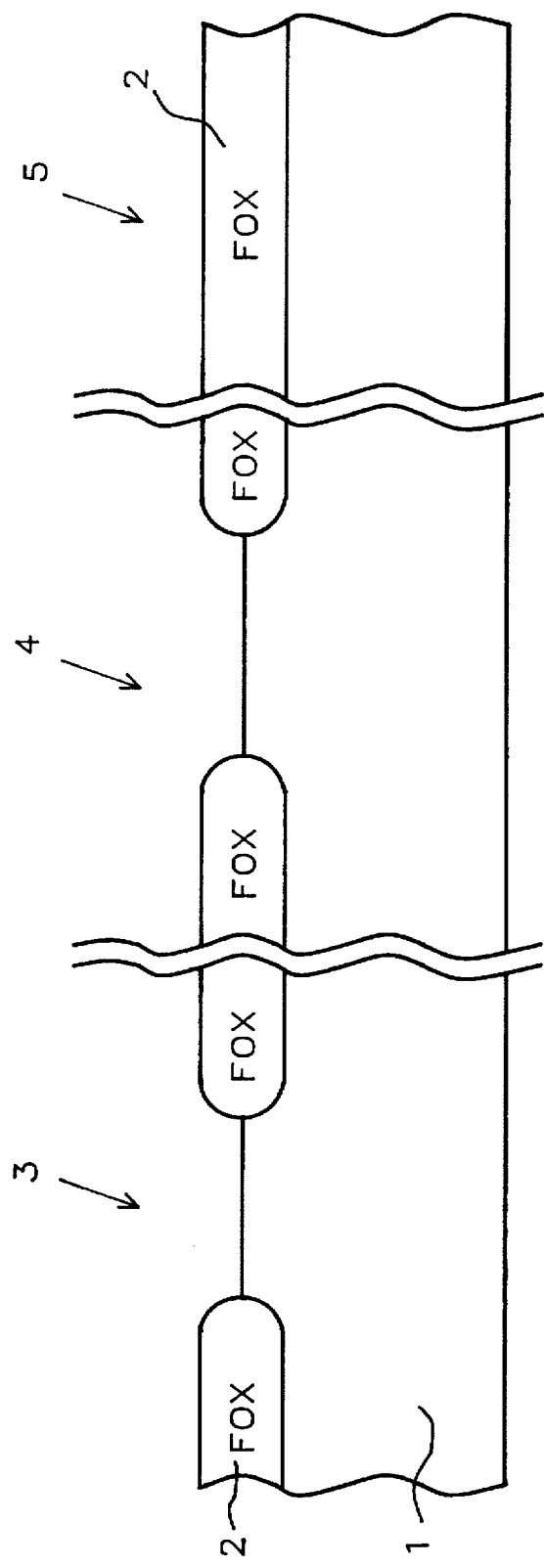
FIGS. 1–10, which schematically, in cross-sectional style, show the stages of fabrication used to simultaneously create MOSFET devices, and a capacitor structure, in which the dielectric layer of the capacitor structure is protected from the MOSFET source and drain drive-in ambients by a thin silicon nitride layer.

A method for simultaneously fabricating MOSFET devices and a capacitor structure, with the capacitor dielectric layer protected by a thin silicon nitride layer during the MOSFET source and drain drive-in anneal, will now be described in detail. A P type substrate, 1, having a <100> crystallographic orientation is used, and schematically shown in FIG. 1. A field oxide region, (FOX), 2, is thermally grown and used to isolate subsequent NFET regions, 3, from PFET regions, 4, and also used as the underlying layer for a subsequent capacitor structure in region, 5. The FOX regions are formed by initially growing a thin pad silicon oxide layer and an overlying silicon nitride layer. Conventional photolithographic and reactive ion etching, (RIE), procedures are used to create a composite insulator pattern of silicon nitride—silicon oxide, that will protect regions of underlying semiconductor substrate, 1, from a thermal oxidation, used to create FOX regions, 2. After removal of the photoresist pattern used to define the composite insulator pattern, a FOX region, 2, is created via thermal oxidation in an oxygen-steam ambient, at a temperature between about 850° to 1050° C., to a thickness between about 3000 to 5000 Angstroms. After creation of FOX regions, 2, the composite insulator pattern is removed via use of a hot phosphoric acid solution for the overlying silicon nitride layer, and a buffered hydrofluoric acid solution for the underlying pad oxide layer.

Figure 2:
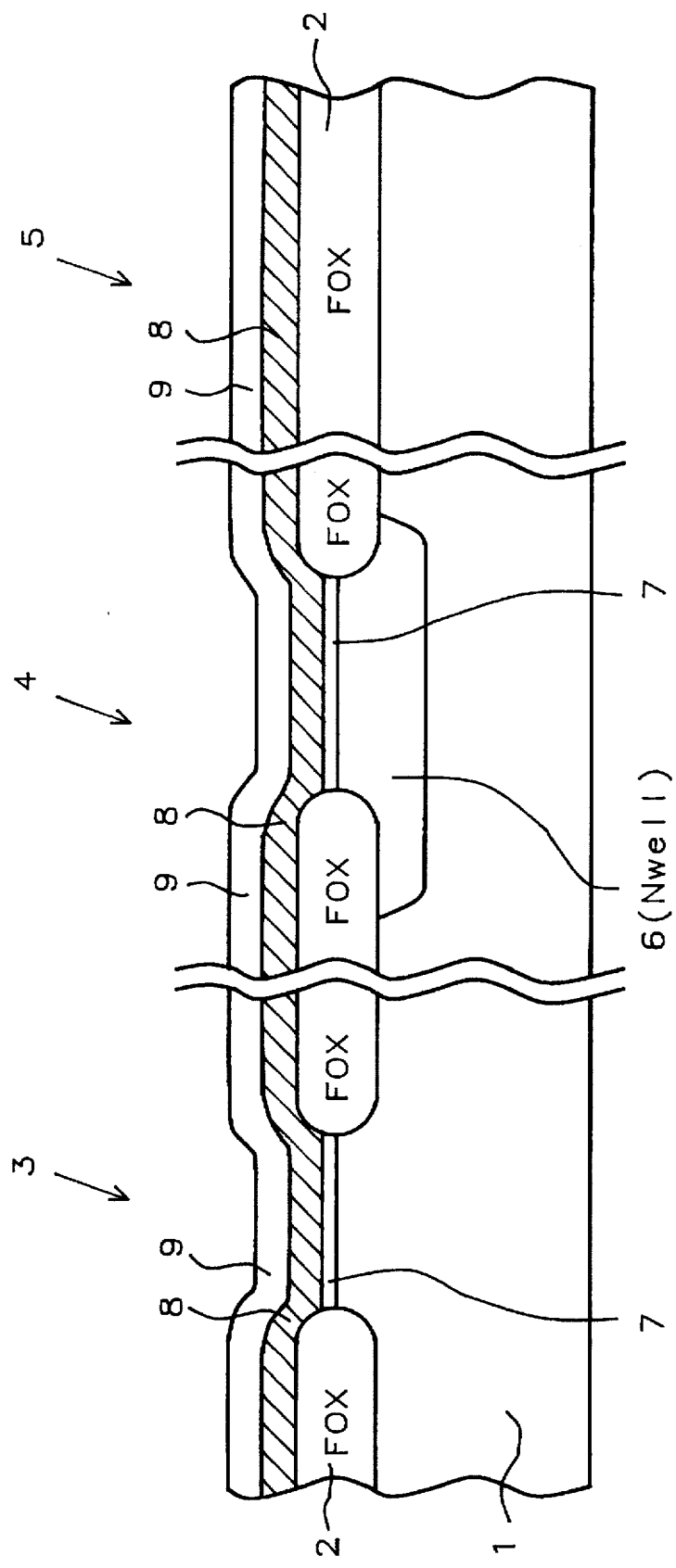

An N well region, 6, is next created for the PFET region, 4, shown schematically in FIG. 2. After forming a photoresist pattern that masks NFET region, 3, and capacitor region, 5, an ion implantation of phosphorous is performed at an energy between about 100 to 180 KeV, to a dose between about 1E12 to 1E13 atoms/cm, to create N well region, 6. After photoresist removal, via plasma oxygen ashing and careful wet cleans, a gate insulator layer, 7, of silicon dioxide, is thermally grown in an oxygen-steam ambient, at a temperature between about 850° to 1000° C., to a thickness between about 50 to 200 Angstroms, in NFET region, 3, and PFET region, 4. Next a layer of polysilicon, 8, is deposited using low pressure chemical vapor deposition, (LPCVD), procedures, at a temperature between about 500° to 700° C., to a thickness between about 2000 to 3500 Angstroms. Polysilicon layer, 8, can either be deposited intrinsically and doped via ion implantation of either arsenic or phosphorous, or polysilicon layer, 8, can be deposited using in situ doping procedures, via the addition of either arsine or phosphine to a silane ambient. A first silicon oxide insulator layer, 9, is next deposited, using either LPCVD or plasma enhanced chemical vapor deposition, (PECVD), procedures, at a temperature between about 500° to 700° C., to a thickness between about 800 to 3000 Angstroms, using tetraethylorthosilicate, (TEOS), as a source, and is shown schematically in FIG. 2.

Figure 3:
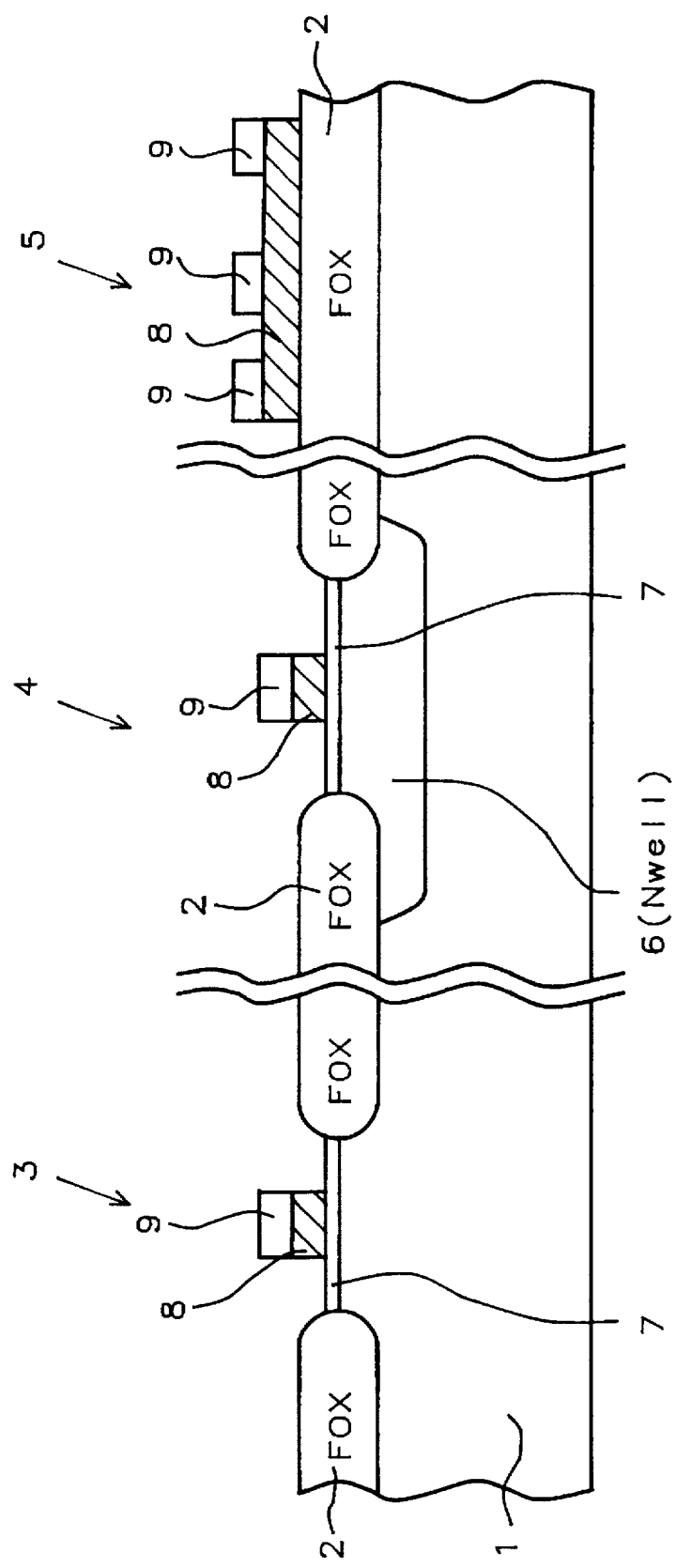
Figure 4:
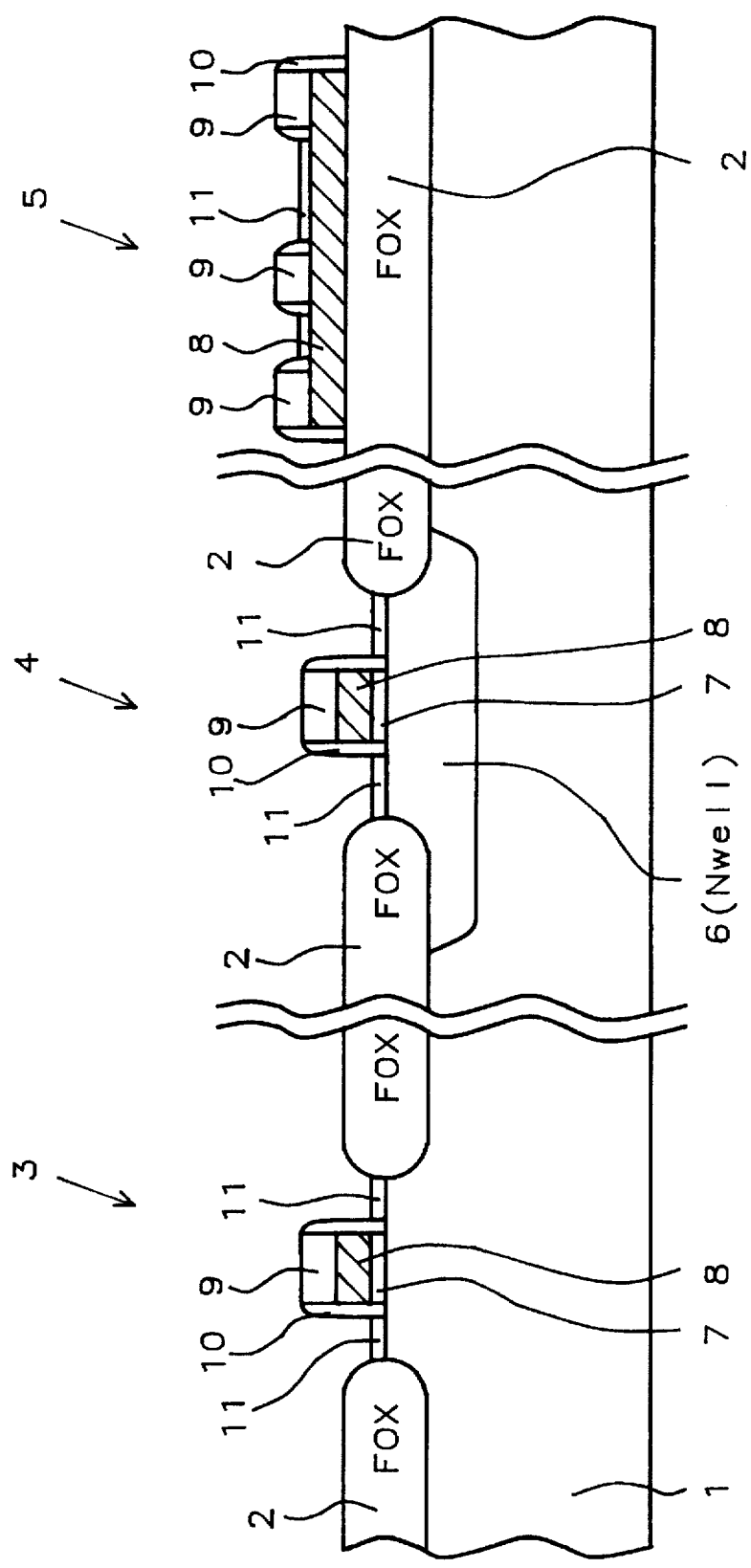

A photolithographic and RIE procedure, using $CHF_3$ as an etchant for silicon oxide layer, 9, and $Cl_2$ as an etchant for polysilicon layer, 8, are used to produce the polysilicon gate structures in NFET region, 3, and PFET region, 4, shown schematically in FIG. 3. The capacitor region, 5, is patterned by a first photolithographic and RIE procedure, using $CHF_3$ as an etchant to create silicon oxide islands, 9, and followed by a second photolithographic and RIE procedure, using $Cl_2$ as an etchant for polysilicon layer, 8, to define the capacitor bottom electrode, schematically shown in FIG. 3. All photoresist patterns are removed, after serving as an RIE mask, via plasma oxygen ashing and careful wet cleans. A second silicon oxide layer is then deposited using LPCVD or PECVD procedures, at a temperature between about 500° to 700° C., to a thickness between about 1500 to 3000 Angstroms, using TEOS as a source, and followed by an anisotropic RIE procedure, using $CHF_3$ as an etchant, to create insulator spacers, 10, on the sides of the polysilicon gate structures, in NFET region, 3, and PFET region, 4, as well as on the sides of the polysilicon bottom electrode, in capacitor region, 5. This is schematically shown in FIG. 4. Also shown in FIG. 4, is the formation of the thin dielectric layer of silicon oxide, 11, thermally grown on the exposed top surface of polysilicon layer, 8, in capacitor region, 5. The silicon oxide layer, 11, is formed via thermal oxidation of polysilicon layer, 8, in an oxygen-steam ambient, at a temperature between about 900° to 950° C., to a thickness between about 55 to 75 Angstroms. Silicon oxide layer, 11, is also formed on NFET region, 3, as well as on PFET region, 4, but removed from NFET region, 3, and PFET region, 4, via photoresist masking of capacitor region, 5, followed by a buffered HF exposure.

Figure 5:
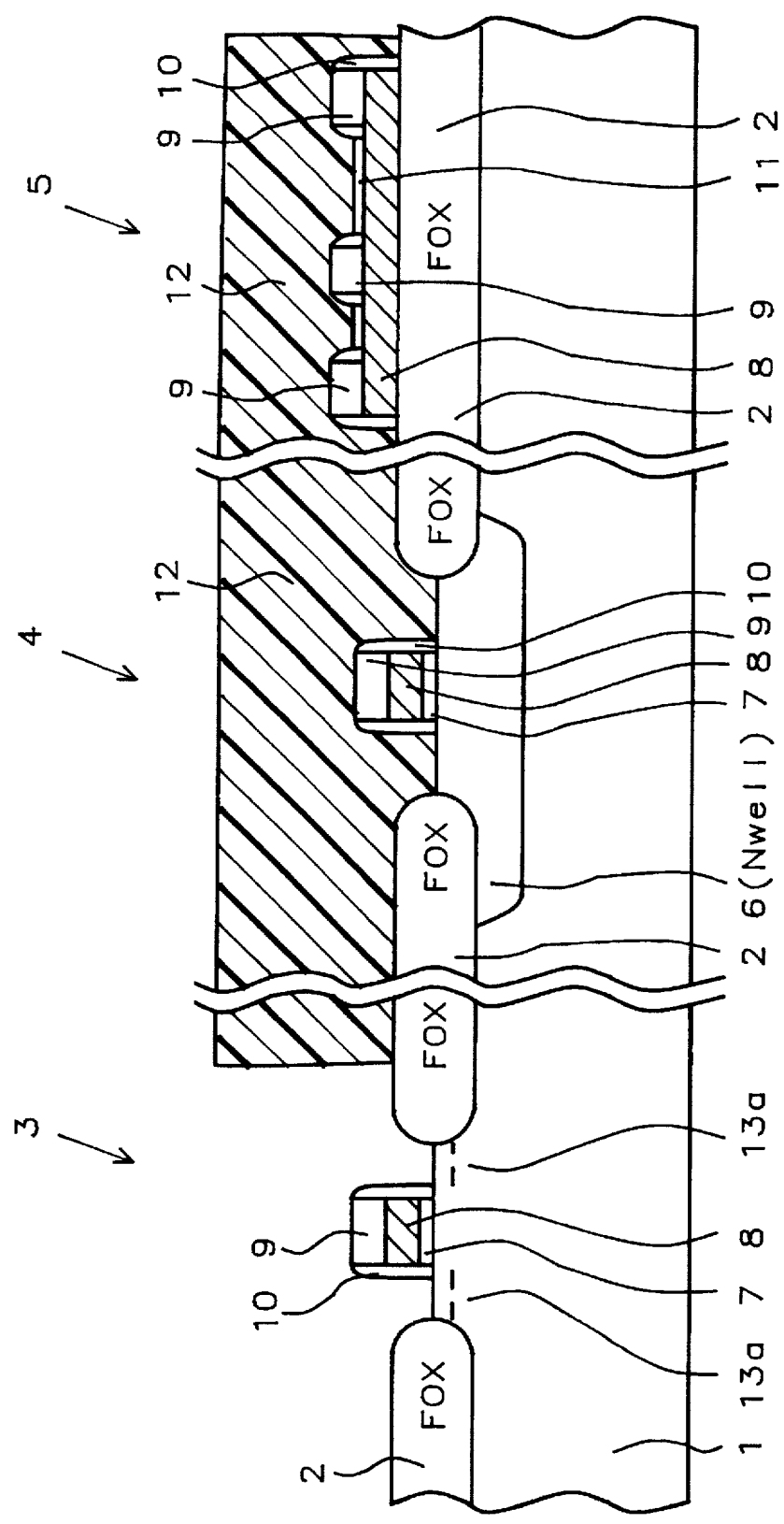
Figure 6:
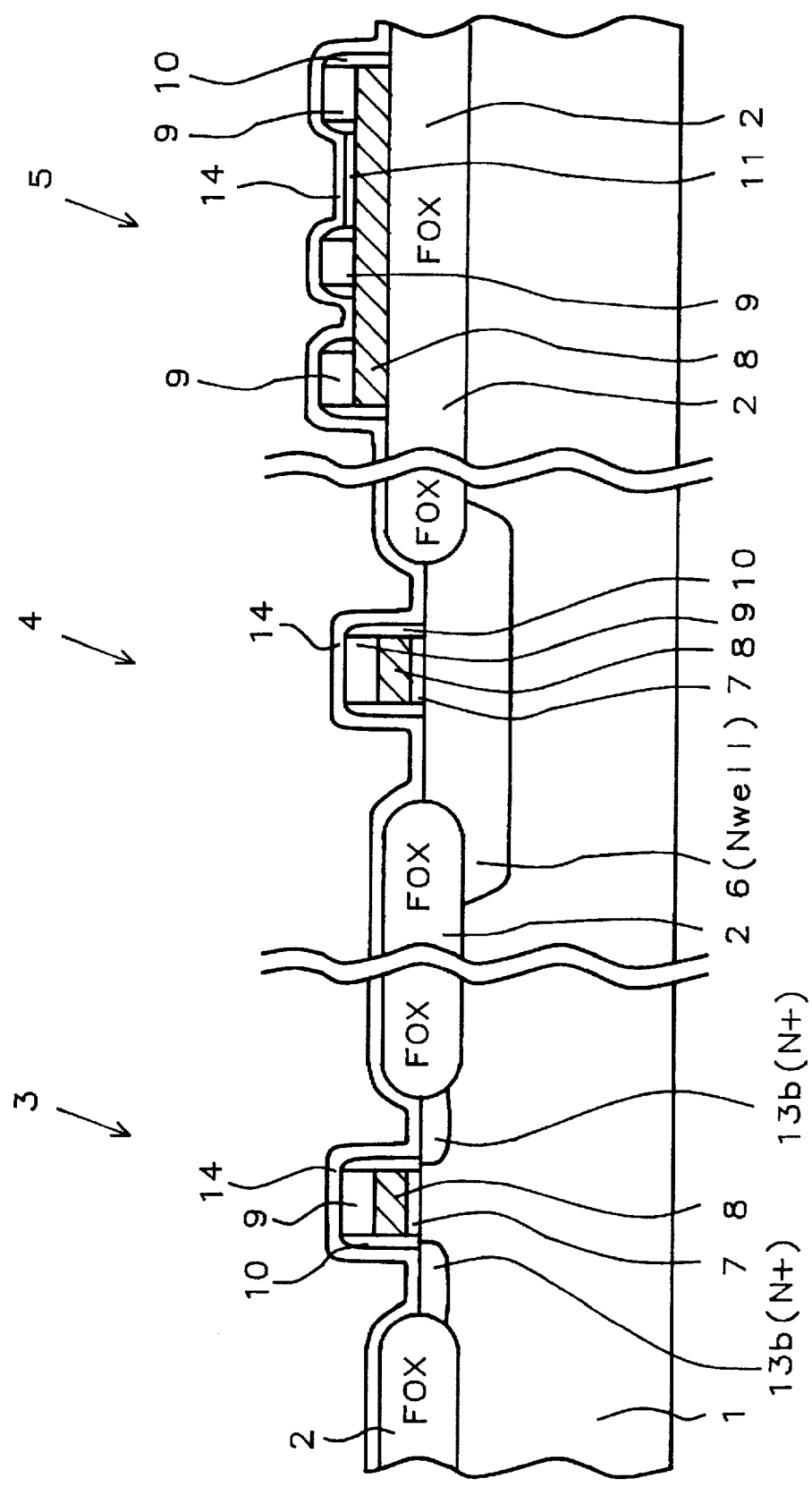

A photoresist pattern, 12, is next formed to allow an ion implantation of arsenic, to be performed at an energy between about 50 to 100 KeV, at a dose between about 1E14 to 5E15 atoms/$cm^2$, to create an N+, arsenic doped region, 13a, created in the NFET region, 3, and schematically shown in FIG. 5. After removal of photoresist pattern, 12, using plasma oxygen ashing and careful wet cleans, a thin silicon nitride layer, 14, is deposited, using either LPCVD or PECVD procedures, at a temperature between about 750° to 850° C., to a thickness between about 270 to 300 Angstroms. Silicon nitride layer, 14, will protect silicon oxide layer, 11, in the capacitor region, 5, from an ambient used for a following source and drain drive-in procedure, used to activate the N+ arsenic dopants, 13a, in NFET region, 3, and to form the N+ source and drain region, 13b, schematically shown in FIG. 6. The drive-in is performed at a temperature between about 950° to 1050° C., for a time between about 30 to 60 min., in a nitrogen ambient. The nitrogen ambient contains between about 0.1 to 0.3 parts per million of oxygen and water, and therefore if silicon oxide layer, 11, is not protected by silicon nitride layer, 14, during the drive-in cycle, additional silicon oxide may form, resulting in an undesirable and uncontrollable capacitor dielectric layer.

Figure 7:
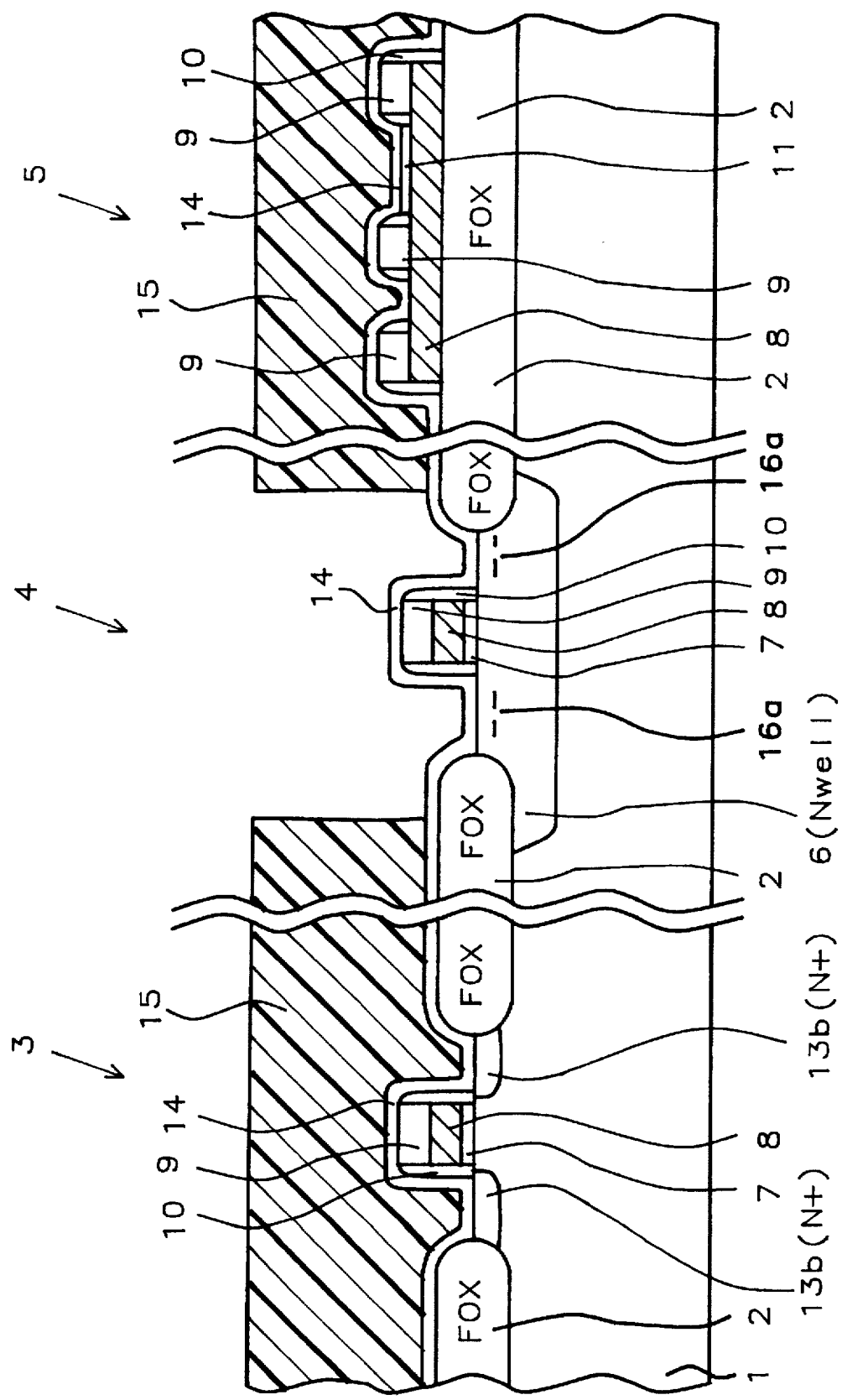
Figure 8:
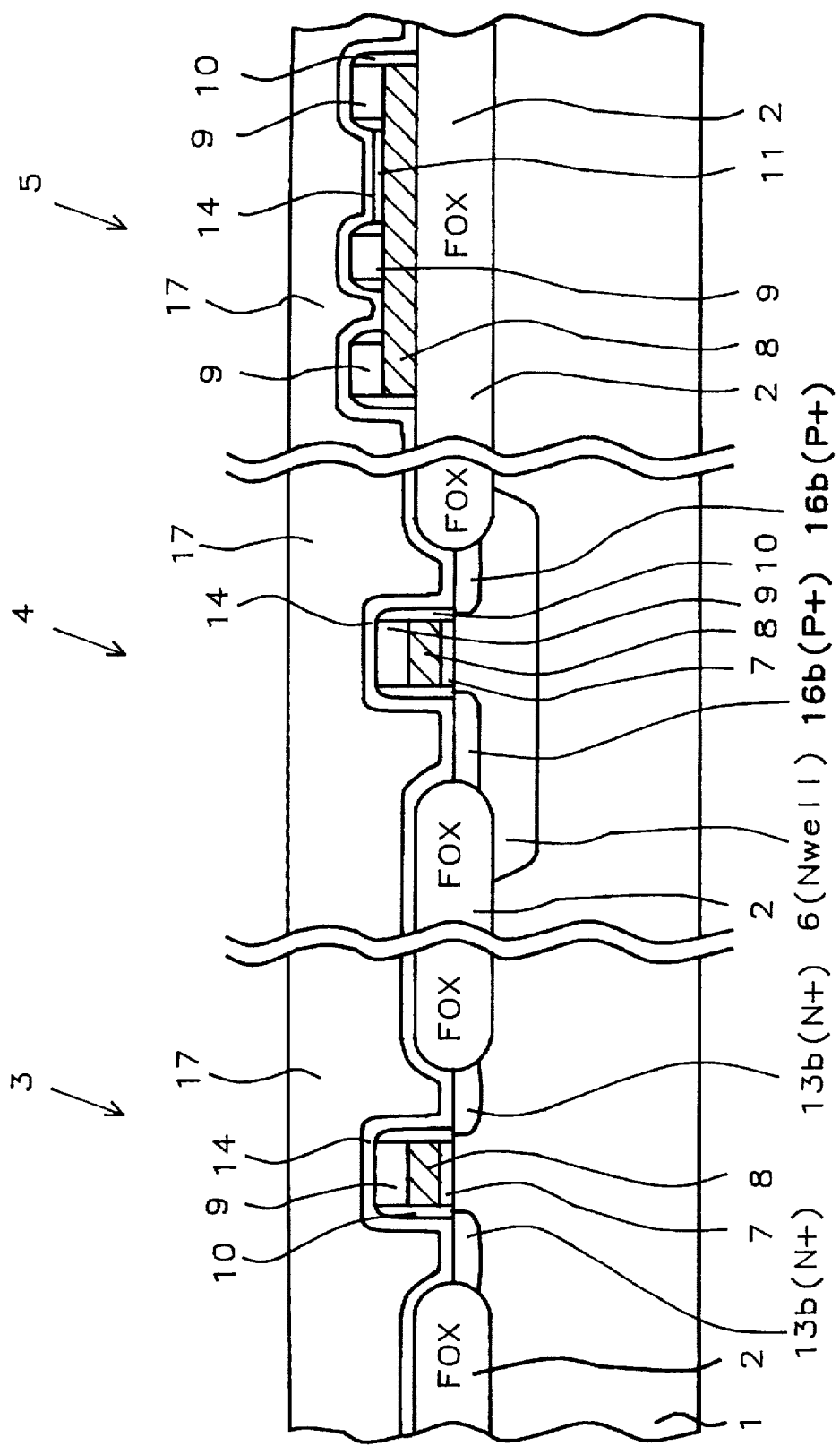

FIG. 7, schematically shows the use of photoresist pattern, 15, allowing a P+ doped region, 16a, to be formed in PFET region, 4, via ion implantation of either $B^{11}$ or $BF_2$, at an energy between about 25 to 75 KeV, at a dose between about 1E14 to 5E15 atoms/$cm^2$. The energy was selected to allow the implanting species to penetrate through the silicon nitride layer, 14, overlying the subsequent source and drain region of the PFET device. Photoresist pattern, 15, is removed again via plasma oxygen ashing and careful wet cleans. A boro-phosphosilicate, (BPSG), layer, 17, is next deposited via PECVD procedures, at a temperature between about 500° to 700° C., to a thickness between about 2700 to 3300 Angstroms, using TEOS as a source, and with the addition of $B_2H_6$ and $PH_3$ reactants. The BPSG layer, 17, is next subjected to an anneal at a temperature between about 800° to 900° C. for purposes of reflowing the BPSG layer to create a smooth topography, and to activate the dopants in P+ dopant region, 16a, thus creating P+ source and drain region, 16b, for PFET region, 4, schematically shown in FIG. 8.

Figure 9:
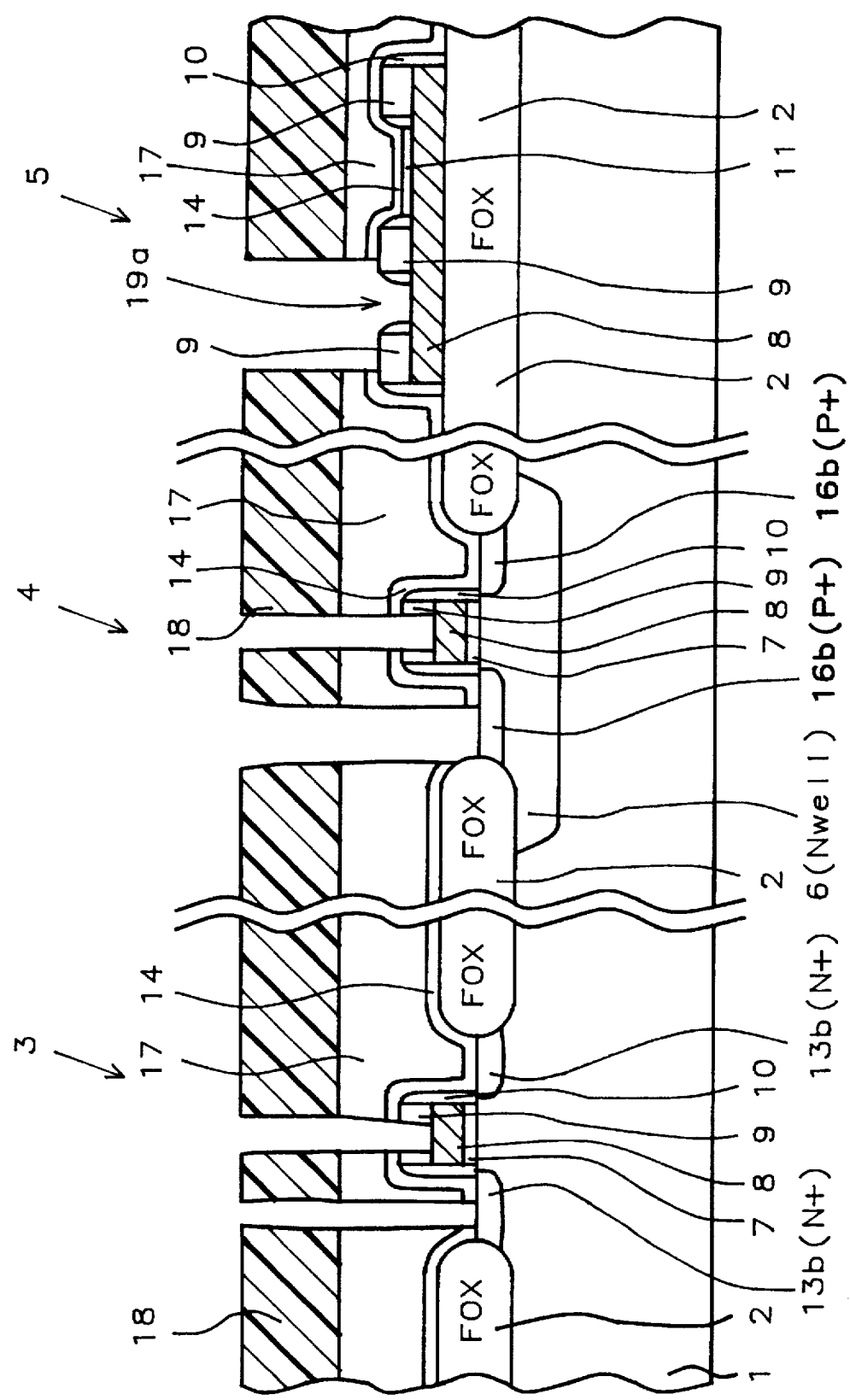
Figure 10:
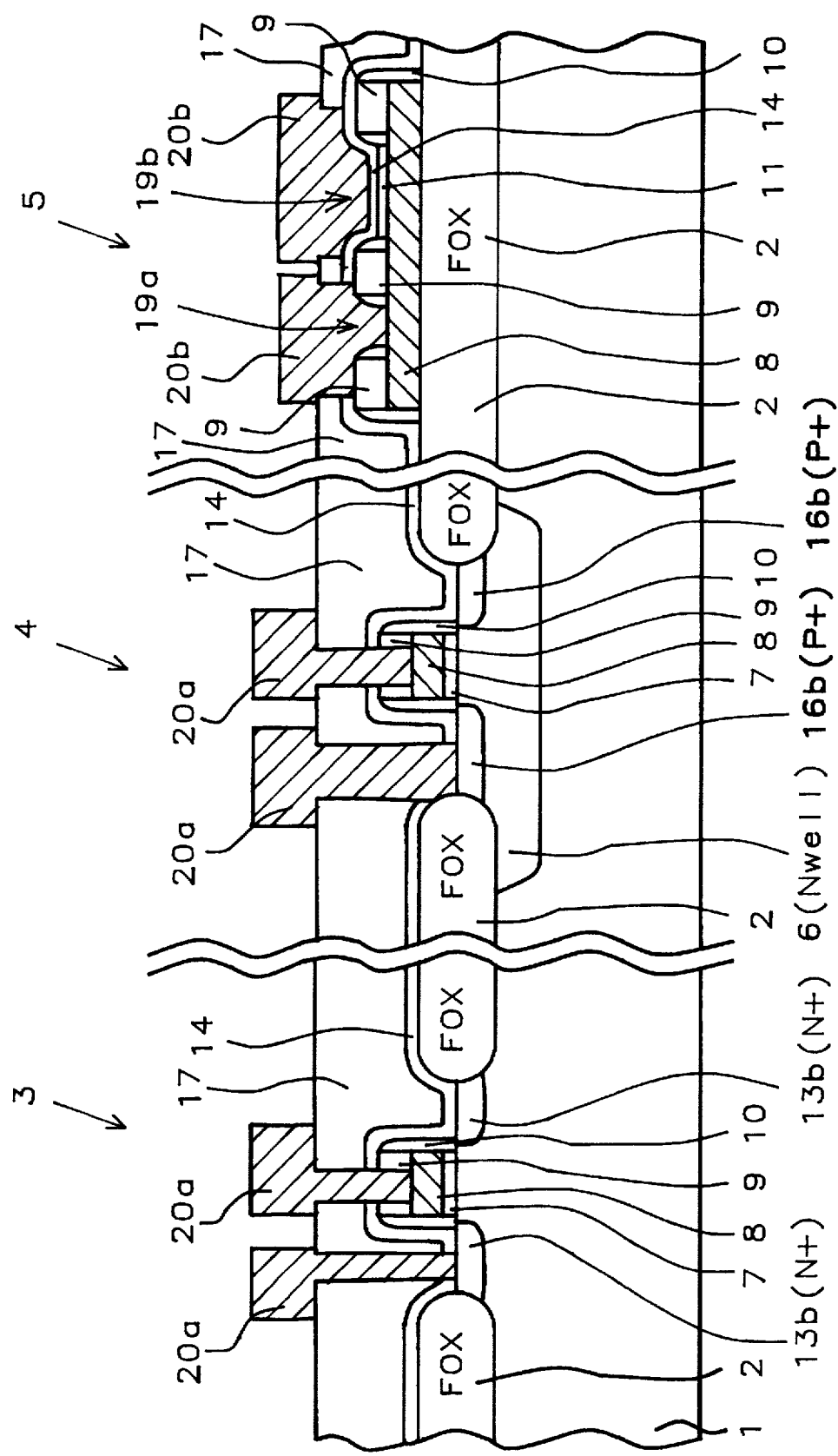

FIGS. 9–10, schematically describe the completion of the capacitor structure, as well as the completion of the NFET and PFET structures. First a photoresist shape, 18, is used to allow opening, 19a, to be created, via RIE procedures using $CHF_3$ as an etchant for BPSG layer, 17, silicon nitride layer, 14, and silicon oxide layer, 11, to expose the top surface of polysilicon layer, 8, to be used for the bottom electrode of the capacitor structure. This procedure also exposes the NFET and PFET polysilicon gate structures, by etching of BPSG layer, 17, silicon nitride layer, 14, and first insulator layer, 9, as well as exposure of the source and drain regions of these devices, via etching of BPSG layer, 17, and silicon nitride layer, 14. This is schematically shown in FIG. 9. After removal of photoresist shape, 18, via plasma oxygen ashing and careful wet cleans, another photoresist shape, (not shown), is used as a mask to allow opening, 19b, to be created, in the capacitor region, 5, using a selective wet etchant, removing BPSG in unmasked regions, but stopping on the top surface of silicon nitride layer, 14. This wet etch procedure, using a buffered HF etch defines the capacitor area. After removal of the photoresist layer, via plasma oxygen ashing and careful wet cleans, a metallization layer of aluminum, containing between about 1 to 3% copper, is deposited using r.f. sputtering procedures, to a thickness between about 3000 to 8000 Angstroms. Another photoresist pattern, (not shown), is used as a mask to allow a RIE procedure, using $Cl_2$ as an etchant, to form interconnect metal structures, 20a, for the MOSFET devices, and to form capacitor contact and upper electrode, 20b, for the capacitor structure, schematically shown in FIG. 10. Photoresist is again removed via plasma oxygen ashing and careful wet cleans.

This invention, a process allowing simultaneously creation of NFET, PFET, and capacitor structures, with a silicon nitride layer protecting the dielectric layer of the capacitor structure, during an NFET source and drain drive-in procedure, can be used to create EEPROM, SRAM, or DRAM cells, for semiconductor chips.

While this invention has been particularly shown and described with reference to the preferred embodiments thereof, it will be understood by those skilled in the art that various changes in form and details may be made without departing from the spirit and scope of this invention.

What is claimed is:

1. A method for simultaneously fabricating a n-channel, MOSFET (NFET) device, a p-channel, MOSFET (PFET) device, and a capacitor structure, on a semiconductor substrate, in which a dielectric layer of said capacitor structure is protected with an oxidation resistant layer, during a NFET source and drain drive-in procedure, comprising the steps of:

forming a pattern of field oxide regions on said semiconductor substrate, comprising a first area of said semiconductor substrate to be used for said NFET device, a second area of said semiconductor substrate to be used for said PFET device, and a third area of said semiconductor substrate to be used for said capacitor structure;

ion implanting a first conductivity imparting dopants into a region of said PFET device, not covered by said field oxide regions, to create an N well region for said PFET device;

growing a gate insulator layer on regions of said semiconductor substrate, not covered by said field oxide regions, to used for said NFET device, and for said PFET device; depositing a polysilicon layer on said gate insulator layer, and on said field oxide regions, of said NFET device, on said gate insulator layer, and on said field oxide regions of said PFET device, and on said field oxide region of said capacitor structure;

depositing a first insulator layer on said polysilicon layer;

patterning of said first insulator layer, and of said polysilicon layer to create polysilicon gate structures, on said gate insulator layer, for said NFET device and for said PFET device;

patterning of said first insulator layer to create first insulator islands, overlying said polysilicon layer, for said capacitor structure;

patterning of said polysilicon layer to create a polysilicon bottom electrode, for said capacitor structure, on said field oxide region, with regions of said polysilicon bottom electrode exposed between said first insulator islands;

forming insulator spacers on sides of said polysilicon gate structures of said NFET, and said PFET devices, and forming insulator spacers on sides of said polysilicon bottom electrode, for said capacitor structure;

growing said dielectric layer on a top surface of said polysilicon bottom electrode, exposed between said first insulator islands;

ion implanting a second conductivity imparting dopants into a region of said semiconductor substrate used for said NFET device, not covered by said polysilicon gate structure, and not covered by said field oxide regions, to be used for source and drain regions of said NFET device;

depositing a silicon nitride layer on said NFET device, on said PFET device, and on said capacitor structure, with said silicon nitride layer overlying said dielectric layer on said capacitor structure;

annealing to activate said second conductivity imparting dopants, in said NFET device, to create said source and drain regions for said NFET device;

ion implanting a third conductivity imparting dopants into a region of said semiconductor substrate used for said PFET device, not covered by said polysilicon gate structures, and not covered by said field oxide regions, to be used for source and drain regions of said PFET device;

depositing a second dielectric layer;

annealing of said second dielectric layer;

opening a first contact holes in said second dielectric layer, and in said silicon nitride layer, to expose said source and drain regions of said NFET device, and of said PFET device, while opening a first hole in said second dielectric layer, in said silicon nitride layer, and in said dielectric layer, to expose a first region of said polysilicon bottom electrode, between said first insulator islands, to be used for metal contact to said polysilicon bottom electrode, of said capacitor structure;

opening a second hole in said second dielectric layer, to expose a region of said silicon nitride layer, overlying said dielectric layer, between said first insulator islands, to define an area of said capacitor structure;

depositing an interconnect metallization layer; and patterning of said interconnect metallization layer to create metal contact structures to elements of said NFET device, to elements of said PFET device, and to said polysilicon bottom electrode, of said capacitor structure, in said first contact holes and said first hole, while creating a metal upper electrode, in said second hole of said second dielectric layer, with said metal upper electrode overlying said silicon nitride layer, and said dielectric layer.

2. The method of claim 1, wherein said polysilicon layer is deposited using low pressure chemical vapor deposition (LPCVD) procedures, at a temperature between about 500° to 700° C., to a thickness between about 2000 to 3500 Angstroms.

3. The method of claim 1, wherein said first insulator layer is silicon oxide, deposited using either LPCVD or plasma enhanced chemical vapor deposition (PECVD) procedures, at a temperature between about 500° to 700° C., to a thickness between about 800 to 3000 Angstroms, using tetraethylarthosilicate (TEOS) as a source.

4. The method of claim 1, wherein said dielectric layer is silicon oxide, thermally grown on said polysilicon layer, in an oxygen-steam ambient, at a temperature between about 900° to 950° C., to a thickness between about 55 to 75 Angstroms.

5. The method of claim 1, wherein said second conductivity imparting dopants are arsenic, ion implanted at an energy between about 50 to 100 KeV, at a dose between about 1E14 to 5E15 atoms/cm$^2$.

6. The method of claim 1, wherein said silicon nitride layer is deposited using either LPCVD or PECVD procedures, at a temperature between about 750° to 800° C., to a thickness between about 270 to 330 Angstroms.

7. The method of claim 1, wherein said annealing, used to activate said second conductivity imparting dopants, and to form said source and drain regions, for said NFET devices, is performed at a temperature between about 950° to 1050° C., for a time between about 30 to 60 min., in an nitrogen ambient.

8. The method of claim 1, wherein said second dielectric layer is a boro-phosphosilicate glass, (BPSG), layer, deposited using PECVD procedures, at a temperature between about 500° to 700° C., to a thickness between about 2700 to 3300 Angstroms, using $B_2H_6$, $PH_3$ and $SiH_4$.

9. The method of claim 1, wherein said NFET device, said PFET device, and said capacitor structure are used as components for an erasable electrically programmable read only memory (EEPROM) cell, on said semiconductor substrate.

10. The method of claim 1, wherein said NFET device, said PFET device, and said capacitor structure, are used for components for a static random access memory (SRAM) cell, on said semiconductor substrate.

11. The method of claim 1, wherein said NFET device, said PFET device, and said capacitor structure, are used for a dynamic random access memory (DRAM) cell, on said semiconductor substrate.

* * * * *